United States Patent [19]

Hogrefe

[11] Patent Number: 5,025,454

[45] Date of Patent: Jun. 18, 1991

[54] PULSE TO ZERO DIGITAL (PZ) MODULATION

[75] Inventor: Arthur F. Hogrefe, Laurel, Md.

[73] Assignee: The Johns Hopkins University, Baltimore, Md.

[21] Appl. No.: 380,576

[22] Filed: Jul. 17, 1989

[51] Int. Cl.$^5$ .................................... H04L 27/02
[52] U.S. Cl. ............................. 375/41; 375/94
[58] Field of Search ............... 375/25, 41, 22, 94; 360/40, 45; 341/69, 58, 63, 64; 329/311; 332/106

[56] References Cited

U.S. PATENT DOCUMENTS

| | | | |
|---|---|---|---|
| 3,510,780 | 5/1970 | Buehrle | 375/22 |
| 3,796,831 | 3/1974 | Bauer | 375/22 |
| 3,859,631 | 1/1975 | Holmes et al. | 375/87 |
| 3,938,082 | 2/1976 | Schowe, Jr. | 375/87 |
| 4,047,107 | 9/1977 | Dickinson | 375/22 |
| 4,072,923 | 2/1978 | Siem et al. | 370/108 |
| 4,186,375 | 1/1980 | Castellani et al. | 360/40 |
| 4,317,207 | 2/1982 | Fujimura et al. | 375/37 |
| 4,361,895 | 11/1982 | Khoudari | 375/87 |
| 4,393,493 | 7/1983 | Edwards | 370/110 X |
| 4,561,443 | 12/1985 | Hogrefe et al. | 604/65 |
| 4,703,476 | 10/1987 | Howard | 375/88 |
| 4,805,194 | 2/1989 | Wesolowski | 375/75 |

Primary Examiner—Stephen Chin
Attorney, Agent, or Firm—Robert E. Archibald; Howard W. Califano; Francis A. Cooch

[57] ABSTRACT

A "pulse to zero" modulation scheme is taught to transmit binary information by modulating a bit mark onto a carrier at the start of each "0" in the bit stream. The "pulse to zero" decoder produces an output that switches to "0" at the occurrence of the detected bit mark and resets to "1" if a second bit mark has not occurred within a preset time lapse from the previously detected bit mark.

10 Claims, 4 Drawing Sheets

PULSE TO ZERO DIGITAL (PZ) MODULATION

STATEMENT OF GOVERNMENTAL

The Government has rights in this invention pursuant to Contract No. N00039-89-C-5301 awarded by the Department of the Navy.

BACKGROUND OF THE INVENTION

1. Field of the Invention

The present invention relates to a new modulation scheme, for use in digital communications called "pulse to zero" (PZ) modulation. A novel receiver and demodulator, useful in detecting and decoding the pulse to zero (PZ) modulation, is also disclosed. Since the receiver requires neither a local power supply or clock, it is uniquely suited for use in medical implants.

2. Description of the Prior Art

Various modulation schemes are known for transmitting pulsed digital communications. Generally either the frequency, amplitude, phase and/or spacing of pulses are modulated in such a manner as to convey useful information.

One such modulation scheme known in the art is pulse position modulation (PPM). In this scheme, the intelligence is contained in the spacing (or time lapsed) between two pulses. Generally, the spacing between a gate pulse and a signal pulse is measured. The following U.S. Pat Nos. teach this modulation scheme: 2,421,022; 2,521,710; 2,837,644; 2,894,127; 3,138,759 and 4,059,806.

Other modulation schemes using pulse spacing or timing are also taught. U.S. Pat. No. 3,209,259 issued to Huber describes a monocycle position modulation scheme in which the position of a single sine wave, within a time period conveys useful information. U.S. Pat. No. 3,713,140 issued to Meslener describes a decoder in which a transition occurring at the middle of a bit cell indicates a "1" and a transition occurring at the partition between adjacent bit cells indicates a "0". U.S. Pat. No. 3,537,100 issued to Barjot et al describes a non-return-to-zero (NRZ) code demodulation that decodes a "0" if the number of transitions in a time window are less than a given value and when the number of transitions are greater than the given value. All the above references teach a modulation scheme that first conveys time window information and then "looks" for the occurrence of recognizable event within the time frame.

SUMMARY OF THE INVENTION

The present modulation scheme is novel in its simplicity and elegance. It does not require the transmitted signal to indicate the start of a time frame.

The invention modulation scheme is called "pulse to zero" (PZ) modulation. Under this modulation scheme the carrier is AM modulated to generate bit marks. Bit marks are only generated at the start of each "0" in the bit stream. No other information is modulated onto the carrier signal. The "pulse to zero" decoder produces an output that switches to "0" at the occurrence of the detected bit mark and resets to "1" if a second bit mark has not occurred within a preset time lapse from the previously detected bit mark. If no bit marks are sent, the decoder will automatically generate a stream of "1" bits.

The "pulse to zero" (PZ) decoder generally comprises: (1) a timing means, such as a counter, activated by a detected bit mark for generating a reset pulse after a set lapse time; (2) a means, for suspending the timing means, at the occurrence of the reset pulse; (3) a means for generating a "0" bit on the occurrence of the bit mark and for resetting to "1" on the occurrence of the reset pulse. The decoder will provide the following output:

1. a "1" is preset on the output during receiver start-up;
2. a "0" results when a bit mark is detected; and,
3. a "1" results wherever a "0" is not followed by a second bit mark within a set time frame; if no bit marks occur for several time frame periods, the decoder will automatically generate a stream of "1" bits.

The receiver used to decode the pulse to zero modulation may be constructed without a local clock if the transmitting carrier bit mark modulation is less than 100% AM and the lower amplitude during the "bit mark" can be used to maintain the receiver clock. A clock generating circuit detects the carrier signal and generates a clock pulse at the same rate or a multiple of the carrier frequency. In essence, the carrier frequency is the receiver clock that is subsequently used to decode the pulsed to zero modulation. In this embodiment, the carrier must always remain "on", and the bit mark is identified by a period of lower carrier voltage. In addition, a totally passive receiver can be built which contains neither a local clock nor a battery power supply. If a battery power supply is not included, the receiver uses the incoming electromagnetic energy to power the receiver and associated electronics. The simplicity of the receiver design, and the elimination of a battery power supply and a local clock makes the receiver practical for use in medical implants.

A first novel features is a modulation scheme that convey useful information merely by AM modulating a carrier with a bit mark at the occurrence of a "0" bit.

A second novel feature is a decoder which will output a "0" at the occurrence of a bit mark and will automatically switch to a "1" if a bit mark does not occur within a set time frame. The decoder will automatically generate a "1" bit stream for each time window not having a bit mark.

The third novel feature is the use of the carrier frequency to generate the clocking pulse.

A fourth novel feature is the use of the incoming magnetic or electromagnetic energy to power the receiver and associated electronics.

DESCRIPTION OF THE PREFERRED EMBODIMENT

Figure 1:
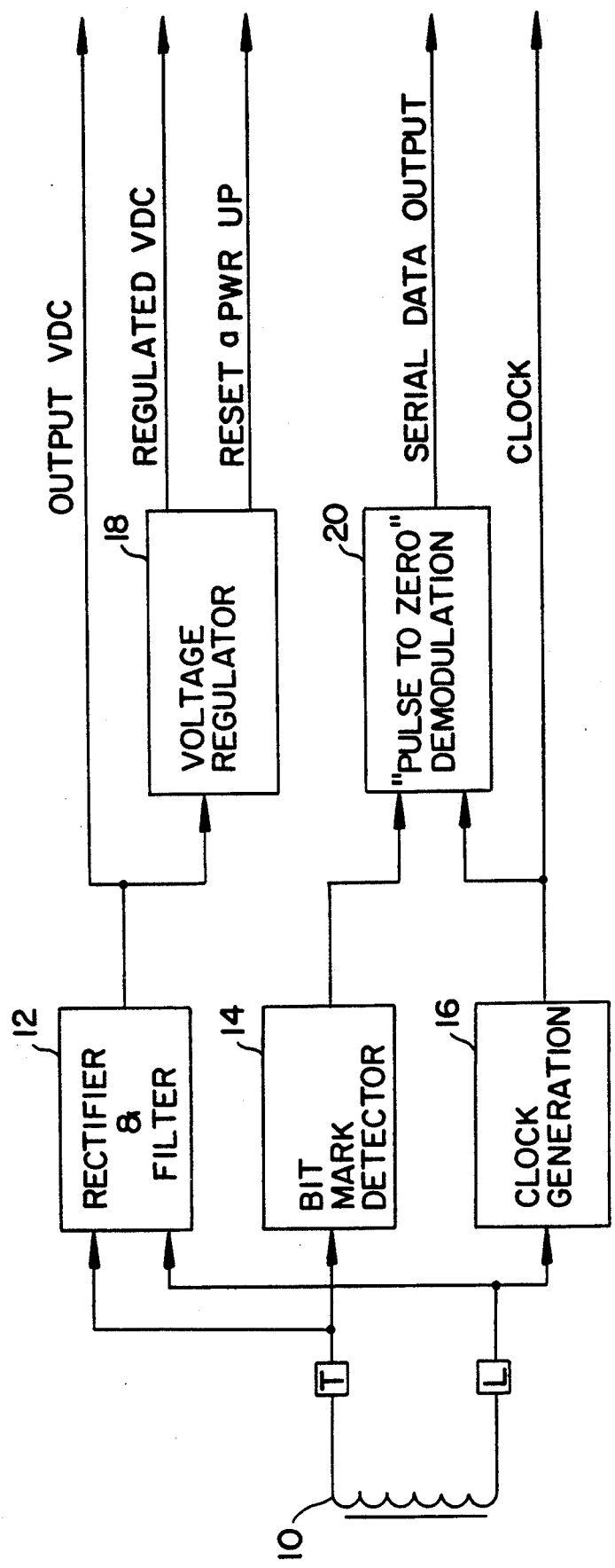
FIG. 1 is a block diagram of the invented receiver to decode pulse to zero (PZ) modulation.

FIG. 1 has a block diagram of a receiver providing "pulse to zero" decoding. A remote signal is detected by pick-up coil 10. The remote signal can be from an inductive (i.e., nonpropagating magnetic) field or alternatively if the input coil 10 is replaced by an antenna, the remote signal can be a propagating rf signal. The detected signal is used to drive: (1) a rectifier and filter 12, if the remote signal is used to power the receiving unit; (2) a bit mark detector 14 to detect bit marks modulated onto the carrier signal; and, (3) a clock generation circuit 16 for providing a clocking signal synchronous with the carrier frequency, or a multiple of the carrier frequency.

Output from rectifier and filter 12 can couple directly to the receiver and control electronics or can pass through a voltage regulator 18 to provide a stable DC voltage. Output from the bit mark detector 14 is input to a "pulse to zero" decoder 20 to generate a serial output data stream. The "pulse to zero" decoder 20 produces an output that switches to "0" at the occurrence of a detected bit mark and resets to "1" if a second detected bit mark has not occurred within a preset time lapse from the previously detected bit mark. Output from the clock generation circuit 16 provides clocking for the "pulse to zero" demodulator 20 and other associated circuitry requiring a clock pulse. The clock generation circuit 16 would supplant the need for a local clock within the receiver. The clock generation circuit 16 detects the carrier signal and generates a clock pulse at the same rate or at a multiple of the carrier frequency.

Figure 2:
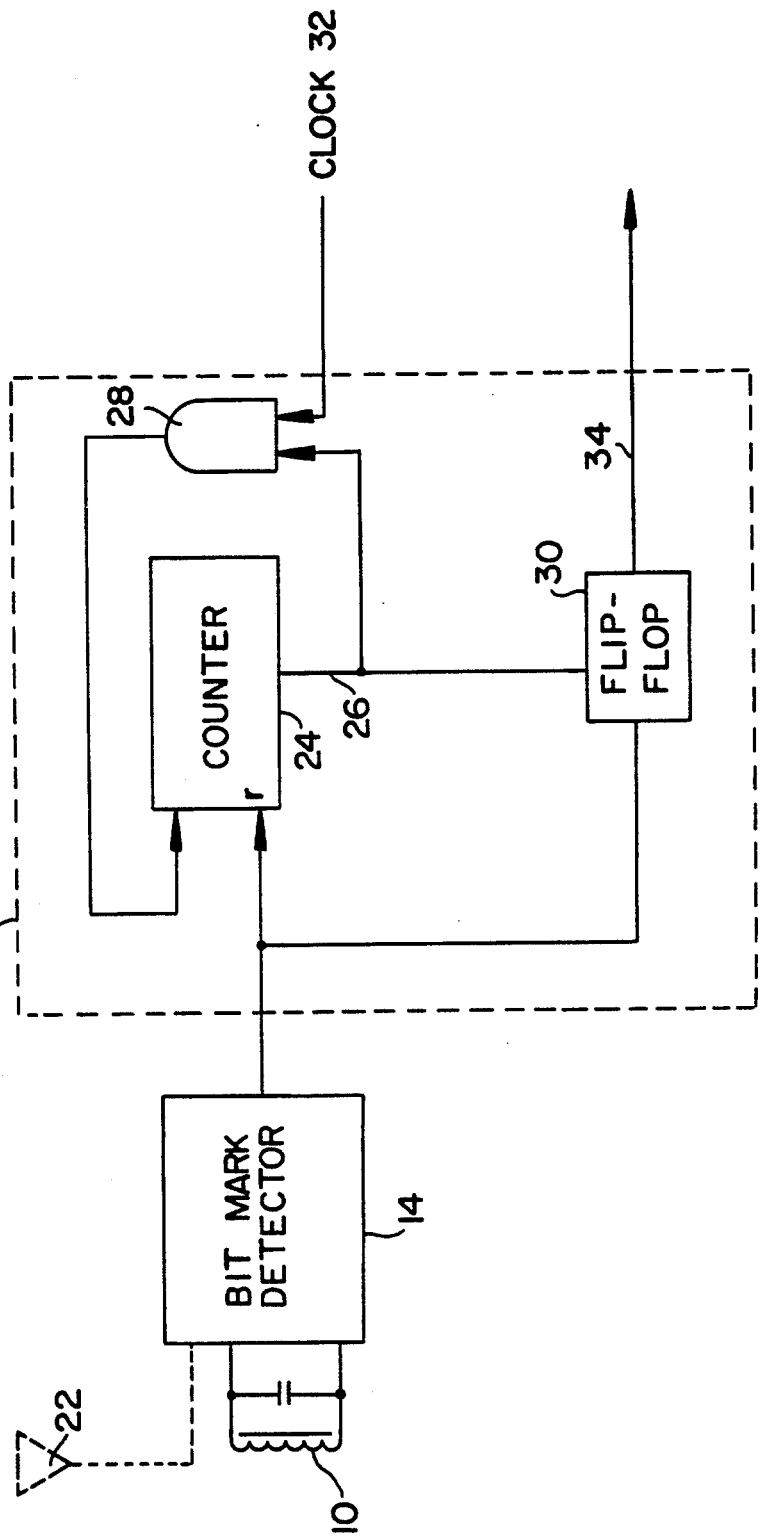
FIG. 2 is a block diagram of the pulse to zero (PZ) demodulator.

FIG. 2 is a more detailed block diagram of the "pulse to zero" demodulator 20. The remote signal is received by pickup coil 10 (in the case of an inductive signal and an antenna 22 in the case of the propagating field), and processed by bit mark detector 14. Bit mark detector 14 detects an amplitude modulated bit mark by generating a digital pulse when a low carrier signal is detected. The "pulse to zero" demodulator comprises: (1) a timing means 24, actuated by a detected bit mark, for generating a reset pulse 26 at the lapse of a set time period from the occurrence of the bit mark; (2) a clock suspending means 28 for suspending the timing means 24 at the occurrence of the reset pulse 26; and (3) a bit generating means 30 for generating a "0" on the occurrence of a detectable bit mark, and for resetting to "1" at the occurrence of a reset pulse 26. The clock suspending means 28 is shown in FIG. 2 to be an AND gate receiving the reset pulse 26 and clock pulse 32 as inputs. When the reset pulse 26 goes high, the clock signal will not pass through gate 28 and the counter 24 will suspend operation. The clock signal 32 may be generated by a local clock within the receiver or by the clock generation means 16 (see FIG. 1). The output bit generating means 30 is shown in FIG. 2 to be a flip-flop with a detected bit mark setting the flip-flop to "0" and a reset pulse 26 resetting the flip-flop to "1". The output 34 from the flipflop is a demodulated serial data stream.

Figure 3:
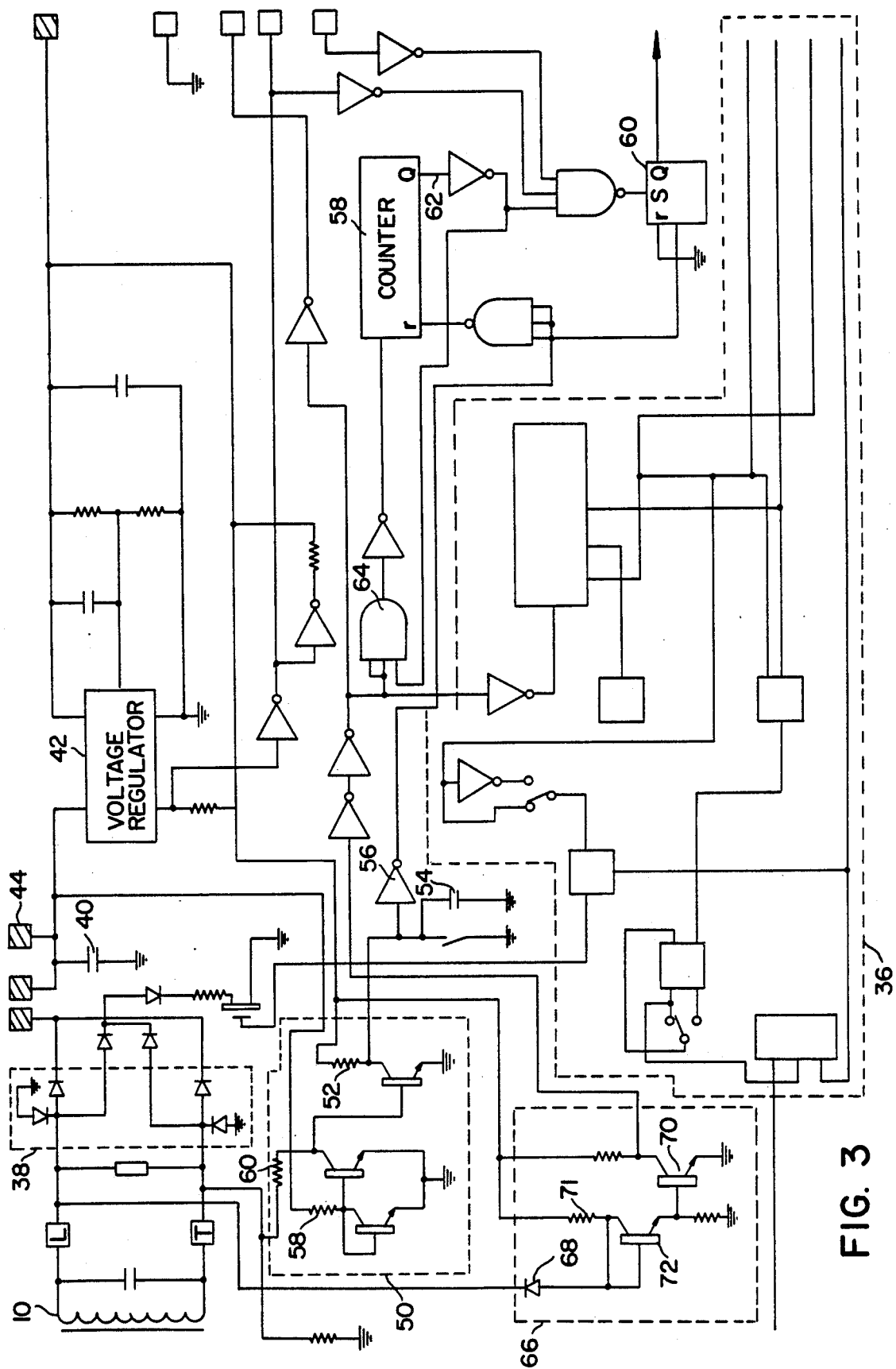
FIG. 3 is a circuit diagram of a transceiver that utilizes a pulse to zero (PZ) receiver.

FIG. 3 is a detailed circuit diagram of the remote digital data transceiver utilizing the pulse to zero receiver modulation scheme. The transmitter portion 36 as shown in FIG. 3, uses a different type of modulation that is not within the scope of the present invention and will not be discussed further. The "pulse to zero" receiver portion receives both power and communication through pick-up coil 10. (The transceiver shown in FIG. 3 was designed for use in an implanted medical device that would not contain a battery and would only be active when powered by an external communication head.) A diode bridge 38 charges storage capacitor capacity 40 which filters the input to a voltage regulator 42 and also provides a DC voltage output 44. The capacitor 40 carries the load during both readout and command modulation when the coil voltage drops. Communication can occur anytime the coil has a loaded voltage of about 4 volts peak or greater.

BIT MARK DETECTOR

In the embodiment shown in FIG. 3, the modulated code sequence consists of 1.25 millisecond "bit marks" which occur at the start of each "0" input. The carrier level is reduced from 40 volts peak-to-peak to 6.0 volts peak-to-peak during "bit mark" interval. The bit mark detector 50 consists of three transistors. Output from the third transistor turns off during the low carrier level allowing resistor 52 to charge capacitor 54. At some point during this charge interval the Schmitt trigger 56 trips initiating a pulse. The circuit resets immediately when the carrier level returns to normal. The bit mark detector 50 compares the peak coil voltage with a DC level on capacitor 40. This is done by comparing the currents in two resistors; resistor 58 sets a value dependent on the DC level and resistor 60 sets a current proportional to the instantaneous voltage at coil 10 terminal T. Whenever resistor 60 passes more current than available on resistor 58, the excess current drives the base of the second transistor in the bit mark detector, causing the third transistor's output to saturate to ground. Resumption of the carrier to its full level at the end of the bit mark causes the output of the third transistor to return to "0".

PULSE TO ZERO MODULATION

Counter 58 is the master timer for decoding command bits. The counter 58 is used to count 5 milliseconds following the termination of each "bit mark". Output from the bit mark detector 50 meets resets counter 50. Output 62 from the counter goes high when the 5 millisecond period has lapsed.

The output flip-flop 60 is initially set to the "1" value. Output from the bit mark detector 50 will clock flip-flop 60 to a "0" value. If no additional "bit marks" occur during that 5 millisecond interval, output 62 from counter 58 goes high setting the flip-flop to a "1". Additionally, when the counter output 62 goes high, gate 64 goes "off" stopping clock input to counter 58 and holding the counter in that condition until a new "bit mark" resets counter 58 and initiates a new timing interval.

Thus, with the "pulse to zero" demodulation scheme, it is practical to send data at 200 bits per second using nothing but AM modulation to produce a "bit mark" just prior to each "0" bit. The "bit mark" provides the only modulation. The receiver detects a "0" bit at the occurrence of a bit mark and returns to a "1" level if no further "bit marks" are encountered within 5 microseconds. In summary, command bits to the receiver are defined in the following manner:

1. A "1" is preset into output flip-flop 60 during the power up reset;
2. A "0" results when the bit mark detector senses a low carrier level returning to full carrier; and
3. A "1" results whenever a "0", is followed by 5 milliseconds of high carrier level.

CLOCK GENERATOR

The embodiment shown in FIG. 3 was designed as part of an implantable medication device used to control a hydrocephalic valve. The implanted device remains completely passive until command signals are received. To reduce the size and power requirement of the implant, and to simplify component requirements, the receiver is designed without a battery and without a local clock. A clock generation circuit 66 is used to generate a clock pulse from the rf carrier signal. The clock generation circuit is an NPN saturated amplifier 70 that is gated "on" and "off" with a pair of diodes (68, 72). The cathode of diode 68 is driven at levels between −0.7 and +19 volts. Diodes 68 and 72 are connected to resistor 71 which acts as a 42 micro ampere current source. The output transistor 70 will be saturated when coil mode L is above 0.7 volts and turned off when below 0.5 volts. The output of transistor 70 provides a reasonable square clock signal at the carrier frequency.

Figure 4:
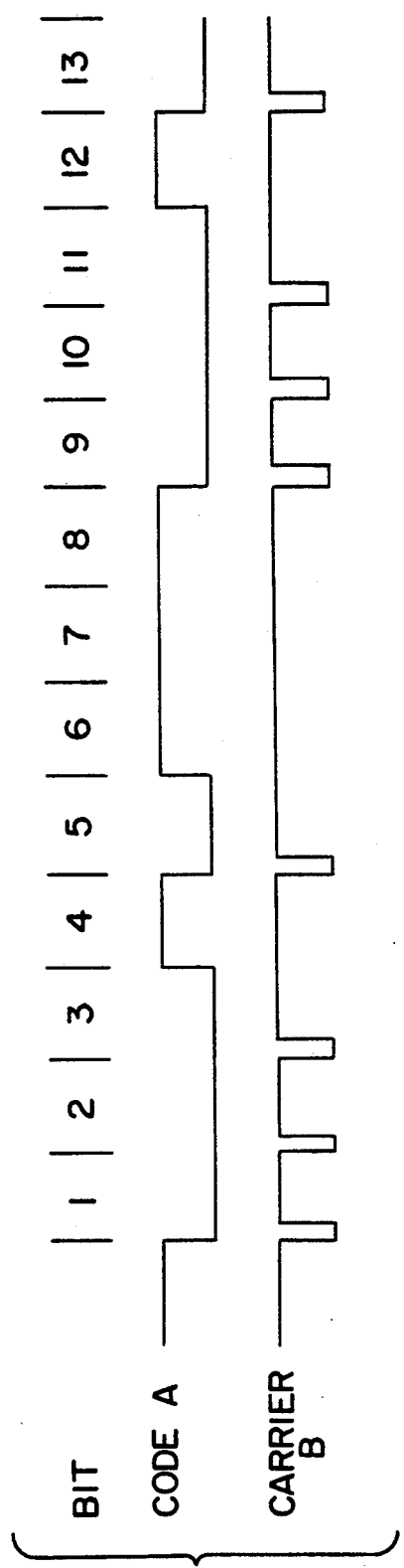
FIG. 4 contains a series of graphs (A,B) showing the waveforms for transmitting a "pulse to zero" modulated signal.
Figure 5:
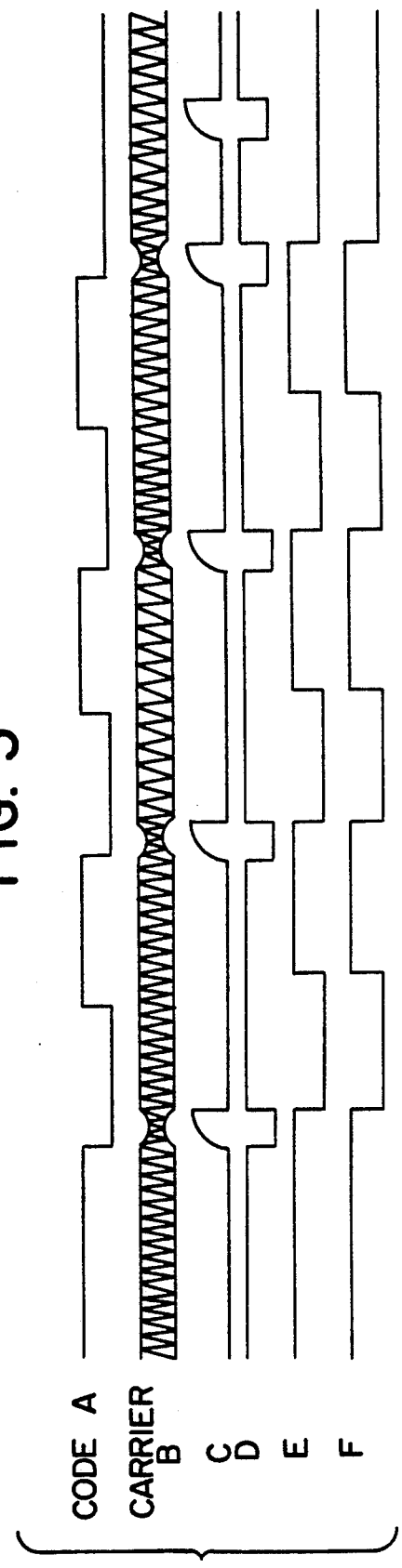
FIG. 5 contains a series of Graphs (A–F) showing the waveforms at different points in the modulation/demodulation scheme.

FIGS. 4 and 5 contain a series of graphs showing the waveforms for "pulse to zero" modulation. In FIG. 4, graph A represents a binary code to be transmitted under "pulse to zero" modulation. In graph B the carrier is modulated with a bit mark at the start of each "Δ" bit. No other information is modulated onto the carrier.

In FIG. 5, graph A shows a second bit sequence to be sent by the "pulse to zero" transmitter. A "1" is indicated by a high carrier signal for 5 milliseconds and a "0" is indicated by a low signal for 5 milliseconds. The carrier signal (Graph B) is AM modulated to generate bit marks. The carrier is reduced to about 15% of its normal level during a 1.25 millisecond "bit mark" interval which proceeds each "1" in the command bit stream. A reduced carrier is used during the "bit mark" (rather than carrier off) in order to maintain the operation of the clock generation circuit. A reduced carrier can be generated by switching a resistance in series with the RF driver during a "bit mark". It is, of course, understood that if a local clock is contained within the receiver, that the "bit mark" can be identified by carrier "off".

The next two graphs (C and D) show the output from the bit mark detector. The receiver detects the AM modulated carrier and generates a pulse at the occurrence of each bit mark modulated onto the carrier. Graph C shows the output 52 from the bit mark detector 50 and graph D shows the output from inverter amplifier 56. (See FIG. 3).

Graph F shows the output from the "pulse to zero" demodulator and in particular the output from the flip-flop 60. Graph E shows the output from counter 62 which goes high 5 milliseconds from detection of a bit mark. As can be seen from the graphs, the output of a flip-flop 60 is controlled by the 1 output from graphs D and E. The flip-flop is initially set to "1". When a "bit mark" is detected, the flip-flop will be reset thereby providing a "0" output. If a second bit mark is not detected within 5 milliseconds, the counter 62 output will go high (see graph E), resetting flip-flop to provide a "1". If, however, a "bit mark" is received within the 5 millisecond period, the counter will be reset and flip-flop 60 will remain set to "0".

Obviously, many modifications and variations of the present invention are possible in light of the above teachings. For instance, the incoming signal can be modulated on an rf carrier, an inductive field, a light beam, or an acoustical signal. Other modifications of the circuit are also possible which will still provide the same "pulse to zero" modulation. It is therefore to be understood that within the scope of the appended claims, the invention may be practiced otherwise than is specifically described.

What is claimed is:

1. A device for decoding a binary code modulated onto a carrier, wherein information is conveyed by the occurrence of a bit mark modulated onto the carrier, said device comprising:

a bit mark detector means for detecting a bit mark modulated onto the carrier signal;, a carrier frequency detector means for regenerating the carrier as a logical compatible train of clock counts; and, a "pulse to zero" demodulation means, operably coupled to said bit mark detector means for switching an output to "0" at the occurrence of a detected bit mark and for resetting the output of "1" if a second detected bit mark has not occurred within a preset number of said clock counts from the previously detected bit mark.

2. A device for decoding a binary code modulated onto a carrier, wherein information is conveyed by the occurrence of a bit mark modulated onto the carrier, said device comprising:

a bit mark detector means for detecting a bit mark modulated onto the carrier signal; and, a "pulse to zero" demodulation means, operably coupled to said bit mark detector means for switching an output to "0" at the occurrence of a detected bit mark and for resetting the output to "1" if a second detected bit mark has not occurred within a preset time lapse from the previously detected bit mark, wherein said "pulse to zero" demodulation means further includes, a timing means, actuated by a detected bit mark for generating a reset pulse at the lapse of said preset time from the occurrence of a detected bit mark, a means for suspending the timing means at the occurrence of said reset pulse, and, a means for generating a "0" bit on the occurrence of a detected bit mark, and for resetting to "1" on the occurrence of said reset pulse.

3. The device of claim 2, further comprising:

a clock generation means associated with said timing means, for producing a clock signal from said carrier signal.

4. The device of claim 3, further comprising:

a means for generating electrical power from the carrier signal and powering the device with said power.

5. A communication system for transmitting a binary bit stream, said system comprising:

a transmitter having,
      a means for generating a carrier signal, and
      a modulation means for amplitude modulating a bit mark onto the carrier signal at the occurrence of each "0" bit in the binary bit stream;

a receiver having,
      a means for detecting the carrier signal,
      a bit mark detector means for detecting a bit mark modulated onto the carrier signal,
      a carrier frequency detector means for regenerating the carrier as a logical compatible train of clock counts, and
      a "pulse to zero" demodulation means, operably coupled to said bit mark detector means for switching an output to "0" at the occurrence of a detected bit mark and for resetting the output to "1" if a second detected bit mark has not occurred within a preset number of said clock counts from the previously detected bit mark.

6. A communication system for transmitting a binary bit stream, said system comprising:

a transistor having,
      a means for generating a carrier signal, and a modulation means for amplitude modulating a bit mark onto the carrier signal at the occurrence of each "0" bit in the binary bit stream; and, a receiver having, a means for detecting the carrier signal, a bit mark detector means for detecting a bit mark modulated onto the carrier signal, and a "pulse to zero" modulation means, operably coupled to said bit mark detector means for switching an output to "0" at the occurrence of a detected bit mark and for resetting the output to "1" if a second detected bit mark has not occurred within a preset time lapse from the previously detected bit mark, wherein said "pulse to zero" demodulation means further includes, a timing means, actuated by a detected bit mark for generating a reset pulse at the lapse of said preset time from the occurrence of a detected bit mark, a means for suspending the timing means at the occurrence of said reset pulse, and, a means for generating a "0" bit on the occurrence of a detected bit mark, and for resetting the "1" on the occurrence of said reset pulse.

7. The device of claim 6, wherein said receiver further comprises:

a clock generation means associated with said timing means, for producing a clock signal from said carrier signal.

8. The device of claim 7, wherein the modulating means partially lowers the carrier level to generate a bit mark, however the carrier remains large enough for the clock generation means to generate a clock signal from the carrier.

9. A modulation and demodulation method comprising:

modulating a bit mark onto a carrier signal at the start of each "0" in a bit stream to be transmitted;

receiving the modulated carrier and detecting each bit mark;

regenerating the carrier as a logical compatible train of clock counts; and, decoding the bit mark sequence by outputting a "0" at the occurrence of each detected bit mark and resetting the output to "1" if a second bit mark has not occurred within a preset number of said clock counts from the previously detected bit mark.

10. A modulation and demodulation method comprising:

modulating a bit mark onto a carrier signal at the start of each "0" in a bit stream to be transmitted;

receiving the modulated carrier and detecting each bit mark; and, decoding the bit mark sequence by outputting a "0" at the occurrence of each detected bit mark and resetting the output to "1" if a second bit mark has not occurred within a preset time lapse from the previously detected bit mark, wherein said decoding step further involves, generating a reset pulse at the lapse of a preset time from the occurrence of a detected bit mark, suspending the timing means at the occurrence of said reset pulse, and, generating a "0" output bit on the occurrence of a bit mark, and resetting to "1" output bit on the occurrence of said reset pulse.

* * * * *